United States Patent Office 3,827,949

Patented Aug. 6, 1974

3,827,949

ANODIC OXIDE PASSIVATED PLANAR ALUMINUM METALLURGY SYSTEM AND METHOD OF PRODUCING

Valeria Platter and Geraldine C. Schwartz, Poughkeepsie, N.Y., assignors to International Business Machines Corporation, Armonk, N.Y.

Filed Mar. 29, 1972, Ser. No. 239,082

Int. Cl. C23b *5/48;* H01l *11/00*

U.S. Cl. 204—15 10 Claims

ABSTRACT OF THE DISCLOSURE

A method of fabricating an anodic oxide passivated aluminum interconnection metallurgy system on a semicondutor material having an overlying insulating layer by depositing a layer of aluminum on this substrate, anodizing the aluminum layer to form a surface layer of $Al_2O_3$, depositing, exposing, and developing a photoresist layer on the surface of the $Al_2O_3$ layer which overlies the desired metallurgy pattern, removing the exposed portions of the $Al_2O_3$ layer, anodizing the exposed aluminum in an anodizing bath to produce a porous $Al_2O_3$ layer.

BACKGROUND OF THE INVENTION

Field of the Invention

This invention relates to aluminum interconnection metallurgy system for semiconductor devices and methods of producing same, more specifically to an improved aluminum oxide passivated aluminum interconnection metallurgy, either single or multi-level, and methods of producing same.

Description of the Prior Art

The technological development of the semiconductor art has evolved into integrated circuit devices where optimized results are obtained by micro-miniaturization. This has required improved interconnection metallurgy systems with closely spaced lines and interconnected levels of metallurgy patterns. The micro-miniaturization and the accompanying increased current density has been made feasible by newly developed photolithographic techniques, improved material deposition procedures, and now metallurgy systems which employ new combinations of metals and alloys.

A serious problem in fabricating interconnecting metallurgy systems for integrated circuit devices is maintaining the integrity of the insulating layers, particularly between the metallic layers. Substractive etching procedures are used in the more conventional fabrication techniques which result in irregular or nonplanar surfaces as the various surfaces and metallurgy layers are built up. Typically a metal layer of the desired metal is applied over the substrate which is covered with a layer of $SiO_2$ or other insulating material and provided with via holes for making contact to the various active and passive regions in the substrate or underlying metallurgy. A resist layer is deposited, exposed and developed to define and protect overlying desired metallurgy pattern. The metal layer is then subjected to an etchant which removes the uncovered or exposed portions. The metal stripe pattern then presents an embossed pattern. A passivating layer is subsequently deposited, usally by sputter deposition. The thickness of the passivating layer is limited in that via holes must be etched for the subsequent metallurgy layer or contacts. When the via holes are formed by an etchant, an inherently tapered wall is obtained. Since a passivating layer is relatively thin the coverage on the embossed pattern is not uniform. The sidewall of the metallurgy pattern inherently is thinner than the top surface. When the subsequent layer of metal is deposited over the insulating film, an opening in the underlying insulating film presents serious potential problems. An opening between the metal layer which subsequently becomes part of the upper metallurgy pattern could provide a short between the metallurgy layers. If, however, the opening underlies metal to be removed it presents an opening for the etchant which could attack the underlying metallurgy layer and cause an opening in a stripe. The problem becomes more serious as the number of layers of metallurgy are increased since each layer contributes additional irregularity to the upper surface.

Relatively recently the fabrication of alminum metallurgy systems using anodic oxidation to produce $Al_2O_3$ insulating layer has been suggested, for example, papers given at the IEEE Electron Devices Meetings by H. Tsumentu and H. Shiba in October 1969, and by W. R. McMahon in October 1970. This structure and process has associated technical problems. For instance, photoresist used to define the metallurgy pattern does not adhere satisfactorily during anodization. Further, since an anodized layer of $Al_2O_3$ is thicker than the parent patent aluminum layer a planar top surface is not achieved. Still further, it has been found desirable to use an aluminum alloy layer which includes copper to increase the resistance to electromigration. Silicon may be included in the aluminum to preclude alloying of the aluminum with the silicon substrate during heat treatments. In thin film devices this may cause penetration of PN junctions by the metal. It is noted that anodizing an aluminum alloy results in a porous aluminum oxide layer which is incapable of forming a barrier to further anodization in forming the metallurgy patterns.

SUMMARY OF THE INVENTION

An object of this invention is to provide improved aluminum interconnecting metallurgy and packaging structures for integrated circuit semiconductor devices.

Another object of this invention is to provide a new method for fabricating an aluminum interconnecting metallurgy using anodic oxidation to form passivating $Al_2O_3$ layers.

Still another object of the invention is to provide an improved method of forming an aluminum interconnection metallurgy system for an integrated circuit device that has a substantially planar surface configuration.

Still another object of this invention is to provide an improved aluminum metallurgy which embodies aluminum alloy stripes having increased resistance to electromigration and/or alloying with the semiconductor substrate material.

These and other objects of the invention are achieved in a method of fabricating an aluminum interconnection metallurgy system on a semiconductor substrate having an overlying insulating layer wherein a layer of aluminum is deposited on the substrate over the insulating layer, the surface of the aluminum layer anodized to form a layer of $Al_2O_3$, a photoresist layer deposited, exposed, and developed on the surface of the thin $Al_2O_3$ layer to define the desired interconnection metallurgy pattern, removing the exposed portions of the $Al_2O_3$ layer, anodizing the aluminum in an anodizing bath adapted to produce a porous $Al_2O_3$ layer. In a preferred embodiment, the aluminum layer is composed of a lower underlying layer of an aluminum alloy and an upper relatively thin layer of pure aluminum.

BRIEF DESCRIPTION OF DRAWINGS

These and other objects, features and advantages of the invention will become more apparent from the more particular description of preferred embodiments as illustrated in the accompanying drawings.

DESCRIPTION OF PREFERRED EMBODIMENTS

Figure 1:
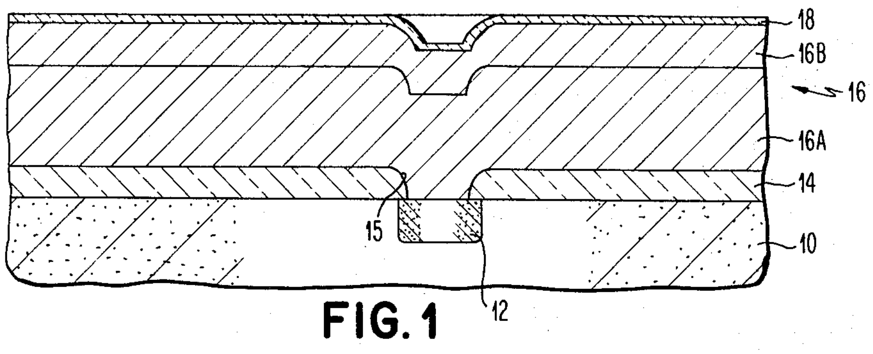
FIGS. 1 through 7 are a sequence of elevational views in broken cross-section of semiconductor devices in various stages of fabrication which illustrate a first embodiment of the method of the invention.

The relative dimensions of the device structure illustrated in the drawings is not necessarily accurately drawn to scale. The vertical dimension is in general greatly enlarged relative to the horizontal dimension in order to more clearly illustrate the novel process steps and structure of the invention. Further, no attempt has been made to illustrate a complete circuit configuration in the metallurgy depicted. Only a small segment of a metallurgy layer of a typical metallurgy circuit pattern is depicted in the drawings.

Because of the high affinity of aluminum surfaces for oxygen, the metal is always covered with a highly resistant oxide film. The improvement of this natural oxide film to produce an anodic oxide film which is attractively finished, has excellent corrosion resistance, and possesses other commercially desired qualities is the aim of the anodizing industry today.

The type of anodic oxide film that can be produced upon aluminum when aluminum is made the anode in an electrolytic cell depends upon several factors, the most important of which is the nature of the electrolyte. Electrolytes in which the formed oxide film is completely insoluble are those electrolytes which will produce barrier type films. The thickness of this film formed at constant current is determined by the forming voltage and the thickness is limited by a breakdown which occurs when a certain thickness is reached. Examples of the type of electrolyte which produce barrier type films include neutral boric acid solutions, ammonium borate or tartrate aqueous solutions with a pH from 5 to 7, ammonium pentaborate in ethylene glycol, and several organic electrolytes including citric, malic, and glycollic acids. The specifying of a neutral pH value of 5 to 7 aqueous solutions for some electrolytes is important since it is considered in strongly acidic solutions these electrolytes do not form completely nonporous barrier films.

Another type of anodic film is slightly soluble and is commonly referred to as porous type oxide. This type of film is not self-limiting as is barrier type film. Due to the porous nature of the film, relatively thick $Al_2O_3$ films can be formed and it is possible to anodize layers of aluminum completely. Examples of the type of electrolyte capable of producing a porous film are fairly numerous, the most commercially important being sulfuric, phosphoric, chromic, and oxalic acids at almost any concentration. In the fabrication of semiconductor devices the choice is more limited since the electrolyte must not significantly degrade the photoresist used to define the areas of the aluminum film or layer to be anodized.

Thus, the general concept of forming $Al_2O_3$ by anodizing an aluminum layer is well known. Further, the broad concept of selectively anodizing portions of an aluminum layer on a semiconductor device to form an insulated metallurgy pattern has been suggested. As previously discussed, such metallurgy and packaging structures have a number of short comings. The structure and methods presented hereinafter solve many prevalent problems and provide the semiconductor industry with greatly improved processes and structures which make the use of anodized $Al_2O_3$ passivated aluminum metallurgy feasible for new technological applications.

Referring now to the drawings, FIGS. 1 through 7 depict a preferred specific method embodiment of the invention. Semiconductor substrate 10, having a surface diffused region 12 and an overlying passivating layer 14 is conventional in the semiconductor device structure. Layer 14 is typically a layer of $SiO_2$ having a thickness about 5000 angstroms that is thermally grown on substrate 10. Contact to the wafer 10 is made through opening 15. A blanket layer 16 of aluminum is then deposited on the top surface of wafer 10 by conventional evaporation techniques. The aluminum layer could alternately be deposited by pyrolytic deposition or electrodeposition using techniques known in the art. In high performance devices where the current density is relatively high, it may be desirable to incorporate a second metal into the aluminum layer to increase the resistance to electromigration. This concept is described and claimed in commonly assigned application Ser. No. 791,371, now Pat. No. 3,725,309 entitled "Cu Doped Al Conductive Stripes and Method Therefore." From one to 10% of copper by weight incorporated in pure aluminum has been shown to greatly increase the resistance to electromigration. Still further, silicon can be also incorporated into the aluminum layer in order to reduce alloying of aluminum with the underlying silcon substrate as disclosed and claimed in U.S. Pat. 3,382,568. However, during fabrication it is desirable that a barrier layer of $Al_2O_3$ be formed on the surface of the aluminum to prevent further anodization of underlying portions. This will be explained in more detail hereinafter. However, when metallurgy other than pure aluminum, as for example, alloys which include copper and silicon, are anodized the resultant $Al_2O_3$ layer is somewhat porous and does not function effectively as a barrier layer. Consequently, in the practice of this invention the blanket aluminum layer 16 is preferably deposited in two separate layers the first underlying layer 16A consisting of an aluminum alloy such as aluminum-copper and a second overlying layer 16B of pure aluminum. The thickness of layer 16B is such that in the final interconnection metallurgy the aluminum cap will be about 2000 angstroms.

There are other reasons for using an aluminum cap layer 16B. The porous anodic formed from aluminum has a denser structure than that formed from aluminum-copper or Al/Cu/Si alloys and is preferred as the uppermost layer in the isolating anodic oxide which is formed in the final anodizing step. As described later, a portion of $Al_2O_3$ is etched away completely. The etchant used does not attack aluminum but may discolor aluminum-copper and would leave a scum of silicon where incorporated into the film. Therefore an aluminum cap must be used. The overall thickness of layer 16 can be any suitable thickness that is receptive to anodization, that is a thickness such that it can be anodized down to the insulating layer 14 in selected areas. In a typical integrated circuit application the overall thickness of layer 16 will be in the range of 5000 A. to 20,000 A.

Figure 2:
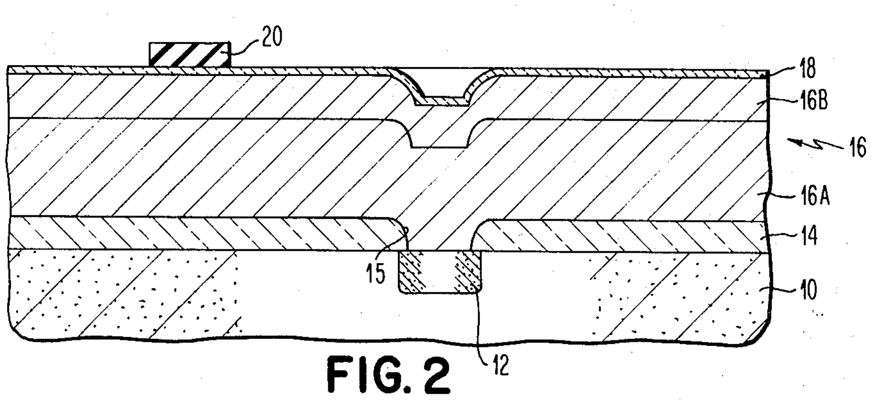
Figure 3:
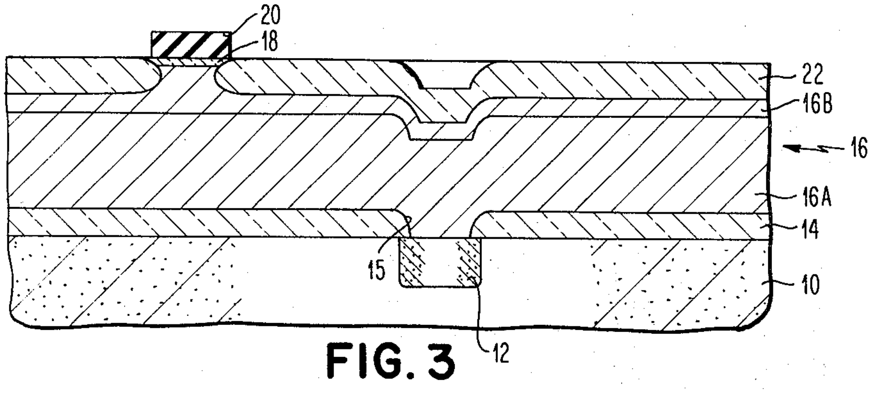

A relatively thin layer 18 on the order of 500 A. of anodic oxide is then formed on layer 16B; this can be either barrier layer or porous oxide. Barrier layer can be formed by immersing the wafer in an electrolyte consisting of 30% ammonium borate in ethylene glycol, making the wafer the anode and providing a suitable cathode in the bath and subjecting the wafer to a current density of about 1 ma./cm.$^2$. The anodization is done at constant current and the voltage allowed to rise until the desired voltage (thickness) is reached. A porous oxide layer can be formed by using an electrolyte consisting of 8% oxalic acid in water and subjecting the wafer to a current density in the range of 1 to 5 ma./cm.$^2$. The anodization is done at constant current and the voltage allowed to reach the value which corresponds to the current density used. The thickness of the anodic oxide formed at a given current density is determined by the anodizing layer. Layer 18 provides a good base for firm adhesion of a photoresist layer. A photoresist layer is then deposited on the anodized surface layer 18. The resist can be any suitable resist, as for example, a photoresist sold under the designation Shipley's AZ1350H or KTFR sold by Eastman Kodak Corporation. The resist layer is exposed through a suitable mask and developed to provide a pattern 20 which overlies the desired via holes provided to make contact between subsequent metallurgy layers. The cross-sectional configuration of the device at this stage of the process is shown in FIG. 2. The anodization of the exposed areas is continued to form a porous $Al_2O_3$ layer 22 as shown in FIG. 3. The anodization is done at constant current in a suitable solution for example in the 8% oxalic acid at a current density on the order of 3.5 ma./cm.$^2$. Other suitable anodizing solutions are a 20% $H_2SO_4$ solution or phosphoric acid. Anodizing in a sulfuric acid solution is not feasible when using a photoresist layer since it erodes the photoresist. However, in this instance, the via hole areas are covered by barrier layer 18. The depth to which the layer 22 is anodized is determined by the thickness of the metal film 16, the degree of planarity of the upper surface desired, and the nature of the subsequent anodization which will be described hereinafter.

Figure 4:
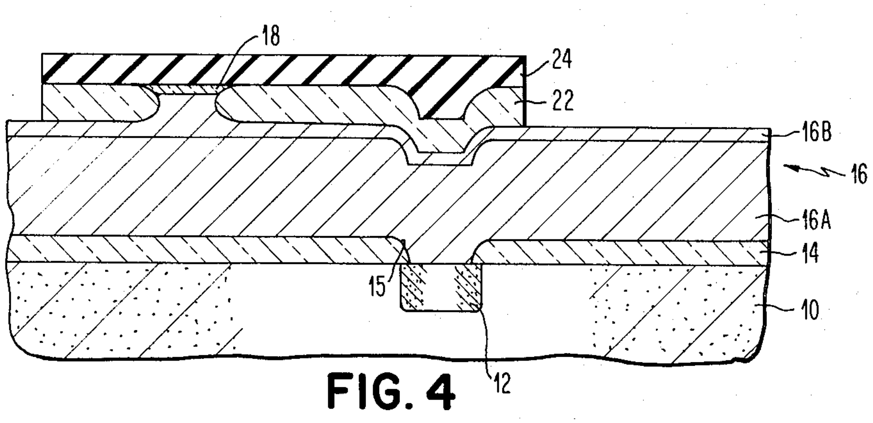
Figure 5:
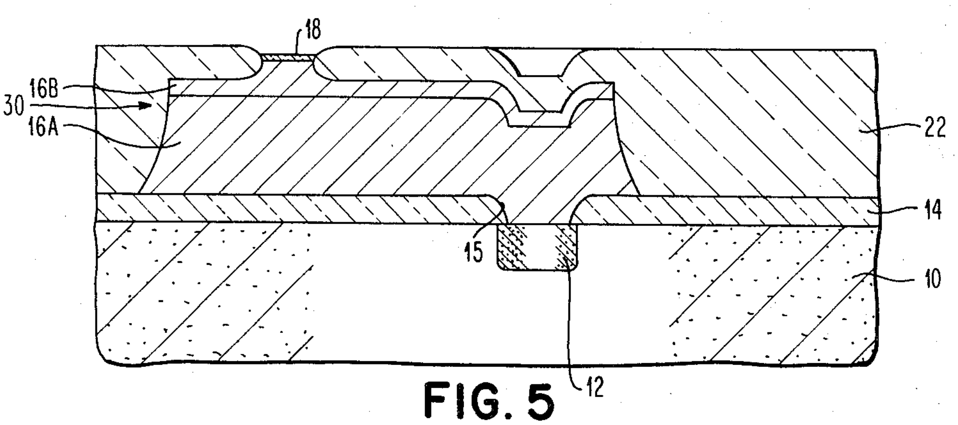
Figure 6:
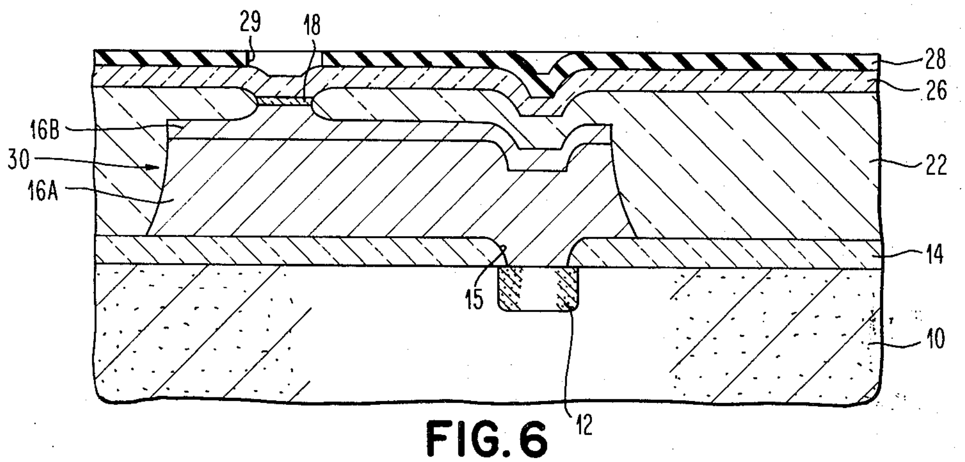

The cross-sectional view configuration of the device at this stage of the process is illustrated in FIG. 3 of the drawing wherein layer 22 is depicted as the porous anodic oxide. A second photoresist layer 24 is then deposited on the surface of layer 22 the resist exposed through a mask to form the desired metallurgy pattern, and the resist developed. After the resist has been developed, portions of the anodic oxide layer 22 are exposed which are subsequently etched away down to the aluminum 16B. The etchant can be any suitable etchant for aluminum oxide which does not materially degrade a resist layer and which does not etch aluminum layer 16. A suitable etch is an aqueous etch consisting of 35 ml. per liter of 85% $H_3PO_4$ and 20 gms./liter of $CrO_3$. Etching the anodic oxide not only compensates for the expansion which occurs when Al and Al alloys are converted into anodic oxide, but in the final structure the definition of the edges of the metallurgy stripes is superior. There is a reduction of bridging between closely spaced stripes and a more uniform stripe width across a wafer is produced. Also the processing is more reproducible. As indicated in FIG. 4 when a two phase aluminum layer consisting of a lower underlying aluminum alloy layer 16A capped with a pure aluminum layer 16B a portion of layer 16B remains after the anodic oxide is removed, as shown in FIG. 4. Following the anodic oxide etch step the wafer is then placed back in an anodic bath and the exposed aluminum layer anodized until all of the exposed portions of the metal layer 16 are converted to porous $Al_2O_3$. Following the anodic oxidation step the surface of the layer is substantially planar as indicted in FIG. 5 of the drawings. Since the volume of anodic oxide is significantly greater than the metal, the degree of planarity achieved is dependent on the portion of the original layer previously removed as $Al_2O_3$. In general 15 to 25% of the original thickness of the aluminum layer should be consumed by the anodization and etching in order to achieve surface planarity after the final anodic oxidation of the remaining metal. The final thickness of the anodized aluminum layer is also influenced by the current density at which the anodization is carried on. In general the higher the current density the thicker the oxide. In general a current density in the range of 2 to 1 ma./cm. sq. is preferred. The temperature at which the anodization process takes place also has an effect of the thickness of the resultant $Al_2O_3$ film. The higher the temperature the thinner is the resultant film.

Figure 7:
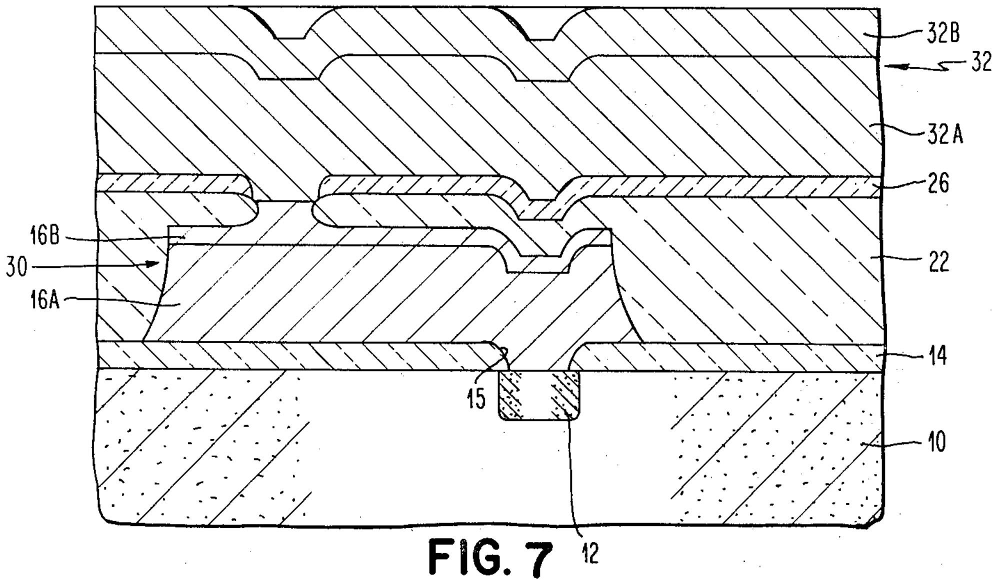

Following the final anodization of the aluminum layer the resist overlying the metallurgy layer is removed, and a thin $SiO_2$ layer 26 deposited on the surface. Layer 26 can be deposited by sputtering, pyrolytic deposition, or by any other suitable technique. A photoresist layer 28 is then formed on the surface of layer 26, exposed, and developed to form an opening 29 over the intended via hole. An opening is then formed through layer 26 utilizing any suitable etch for the material of the passivating layer, as for example, buffered HF solution for $SiO_2$. The use of a buffered HF solution for forming the via hole is particularly advantageous. The buffered HF etch attacks anodic aluminum oxide very slowly. The layer 18 of anodic oxide in the via hole will act as a stop for the buffer etch when via holes are etched thereby minimizing the possibility of etching through the underlying aluminum. The anodic oxide layer 18 can be removed subsequently in the phosphochromic acid etch which does not attack aluminum or $SiO_2$. The thickness of passivating layer 26 can be any suitable thickness and is normally in the range of 2,000 to 5,000 angstroms. The blanket layer 32 of aluminum is then deposited by any suitable technique on the surface of the wafer namely the layer of dielectric material 26 and the steps shown in FIGS. 1 through 6 repeated to form the desired metallurgy configuration electrically joined to the underlying metallurgy layer 30. Preferably the layer 32 of aluminum is again formed of an underlying layer of an aluminum alloy and an overlying layer of pure aluminum. If desired, layer 32 as well as layer 16 can be of pure aluminum particularly if electromigration is not a signficant problem in the completed semiconductor device. The structure of the device is illustrated in FIG. 7. The same sequence of process steps illustrated in FIGS. 1 through 6 can be used to fabricate the second metallurgy level. If more levels of metallurgy are necessary, a blanket layer of Al can be deposited and the steps repeated. The final layer will include device contacts which can be connected to associated apparatus by solder pads, beam lead technology ultrasonic bonding to fine wire contacts or by any other suitable connection technology.

Figure 8:
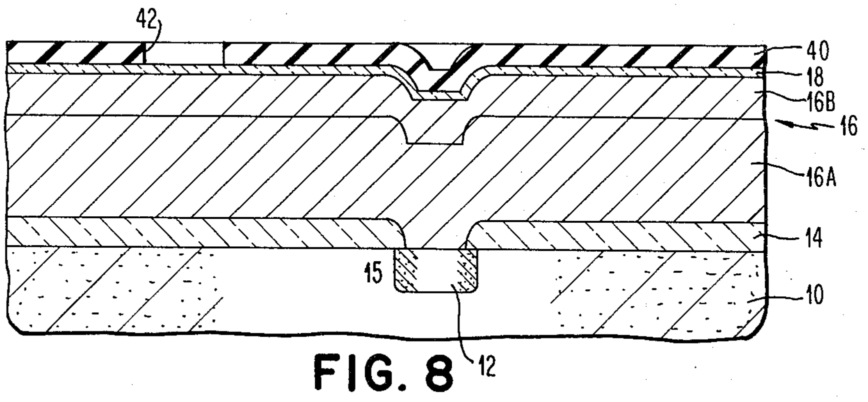
FIGS. 8 through 10 are additional elevational views in broken cross-section of a semiconductor device which taken with the sequence of FIGS. 1 through 7 illustrates another embodiment of the method of the invention.
Figure 9:
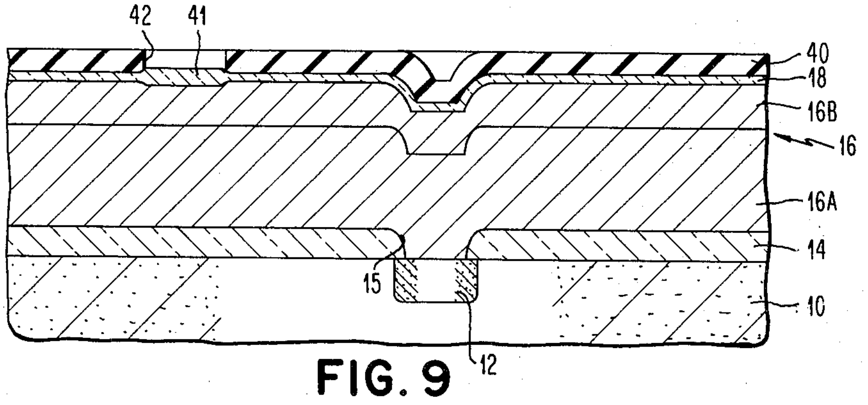
Figure 10:
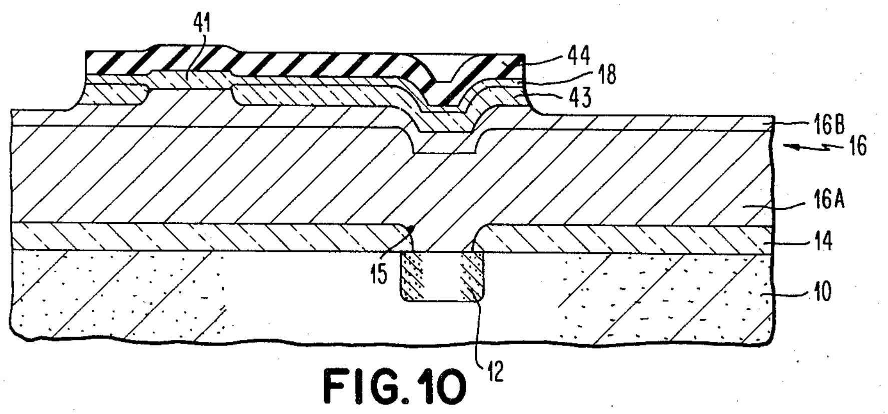

Referring now to FIGS. 8 through 10 there is illustrated another process embodiment of the method of the invention. A photoresist layer 40 is deposited over the thin anodized layer 18. The photoresist is exposed to a suitable mask and developed to remove portions thereof over the ultimate via holes in the device. As shown in FIG. 8, an opening 42 is formed over the intended via. A barrier layer 41 of $Al_2O_3$ is then formed in opening 42 by anodization as indicated in FIG. 9 of the drawing. The barrier layer is formed at contact current in a suitable electrolyte, as discussed previously, at a current density of about 1 ma./cm.$^2$. The photoresist layer 40 is then removed and a blanket porous $Al_2O_3$ oxide layer 43 is formed to a predetermined thicknesss. The barrier layer 41 formed previously will prevent further formation of $Al_2O_3$ in the region of the via. Subsequently a layer of resist 44 is deposited on the $Al_2O_3$ layer 43, exposed and developed to define the desired metallurgy pattern. The previously formed and now exposed portion of $Al_2O_3$ can then be removed with an etchant, as for example, phospho-chromic etch. This step is optional if planarity is not desired or required. The device is subsequently anodized in a suitable bath for forming a porous $Al_2O_3$ layer. The same basic steps illustrated in FIGS. 5 through 7 described previously can then be used to complete fabrication of the metallurgy layer. The barrier layer 41 of $Al_2O_3$ over the via prevents lateral anodization into the via hole areas when forming the interconnecting metallurgy. Retaining the original configuration of the via is particularly important when the stripes of the metallurgy layer are very narrow.

Yet another embodiment of the method of the invention consists of depositing a photoresist layer on the top surface of the anodized aluminum layer 18 such as illustrated in FIG. 1, exposing and developing the resist leaving the desired pattern of the interconnecting metal areas unprotected. The device is then anodized to form a barrier layer similar to layer 42 in the exposed regions. The resist is then removed and the device further anodized in an electrolyte bath suitable for forming a porous oxide insulating layer. The barrier layer pattern will prevent oxidation of the underlying layer thus forming the metallurgy pattern. The areas outside the barrier layer are anodized until the aluminum is completely anodized down to the insulating layer 14. It is understood that the via hole treatment illustrated in FIG. 1, 2, and 3 can be combined with this method embodiment.

Another embodiment of the method consists of forming a barrier layer on the top surface of the aluminum layer 16B. A photoresist layer is deposited on the anodized layer, exposed and developed so that the desired interconnection metallurgy areas are protected. The unprotected anodized layer is removed in a suitable etchant. The resist is then removed and the device further anodized to form the isolating porous oxide.

Another embodiment of this method is desirable when the line widths and spaces in the interconnection metallurgy pattern are very narrow. In certain device applications planarity may not be necessary but the interconnection pattern cannot be formed by standard substractive etching processes. The anodic method described previously using barrier $Al_2O_3$ layer to protect the metallurgy pattern could be used to achieve fine closely spaced interconnection metallurgy. With closely spaced lines the residual metallic particles in the isolating oxide can be a potential shoring hazard. Therefore, the anodic oxide 22 can be removed in phosphochromic etch leaving the interconnection metallurgy pattern 30, the Al pattern reanodized to encapsulate it in a barrier layer, and the residual metal which might otherwise cause shorting removed in a suitable etch which does not attack anodic oxide. The residual metal will not be anodized because it is ordinarily not in electrical contact with the pattern. The remaining metallurgy pattern can be covered with a passivating layer using conventional deposition techniques. In forming the metallurgy pattern disclosed in FIG. 1 through 5, it may be desirable to delete the steps used to form the via contact on the upper surface of the pattern. A single resist can be developed to define the metallurgy pattern.

While there have been shown and described and pointed out the fundamental novel features of the invention as applied to the preferred embodiments, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

We claim:

1. A method of fabricating an aluminum interconnection system on a semiconductor substrate having an overlying insulating layer comprising,
- depositing a layer of aluminum on said substrate over said insulating layer,
- anodizing 15 to 25% of the aluminum layer to form a surface layer of $Al_2O_3$,
- depositing, exposing, and developing a photoresist layer on the surface of the $Al_2O_3$ layer which defines the desired metallurgy pattern,
- removing by etching the exposed portions of the $Al_2O_3$ surface layer.
- anodizing the exposed aluminum layer to completion in an anodizing bath to produce a porous $Al_2O_3$ isolation layer of a thickness substantially equal to the combined thicknesses of the remaining aluminum metallurgy layer pattern and the overlying initially anodized surface layer of $Al_2O_3$.

2. The method of Claim 1 wherein said aluminum layer is comprised of an underlying aluminum-copper alloy layer and a surface layer of pure aluminum.

3. The method of Claim 1 wherein the thickness of the surface layer of $Al_2O_3$ produced by initially anodizing is in the range of 2,000 to 6,000 angstroms.

4. The process of Claim 1 wherein said anodizing bath solution used in the final anodizing step to produce a porous $Al_2O_3$ layer is comprised of 8% oxalic acid in water.

5. The method of Claim 1 wherein the $Al_2O_3$ layer resulting from anodizing the Al layer to completion is removed with an etchant that selectively etches $Al_2O_3$.

6. The method of Claim 1 wherein immediately after deposition of said layer of aluminum, a thin blanket layer of $Al_2O_3$ is formed by anodization of said aluminum layer, a resist layer deposited, exposed, and developed to overlie only via regions, and said aluminum layer further anodized to form said surface layer.

7. The method of Claim 1 wherein immediately after deposition of said layer of aluminum, a thin blanket layer of $Al_2O_3$ is formed by anodization of said aluminum layer,
- a resist layer deposited, exposed, and developed to leave exposed the ultimate via hole regions,
- anodizing the exposed ultimate via hole regions in an electrolyte to form a barrier layer,
- removing the resist layer and anodizing the aluminum layer to form said surface layer of $Al_2O_3$.

8. The method of Claim 1 wherein immediately after deposition of said layer of aluminum, a thin blanket layer of $Al_2O_3$ is formed by anodization of said aluminum layer,
- a resist layer deposited, exposed, and developed to provide a layer overlying the ultimate via hole regions, and subsequently anodizing 15 to 25% of the aluminum layer to form said surface layer of $Al_2O_3$.

9. The method of Claim 1 wherein following the formation of the porous $Al_2O_3$ isolation layer a layer of dielectric is deposited on the surface of the resulting structure, an opening formed through said dielectric layer and through the underlying $Al_2O_3$ layer to expose a region of the metallurgy pattern, and a second metallurgy layer deposited and fabricated that connects with the underlying aluminum metallurgy pattern.

10. A method of fabricating an aluminum interconnecting metallurgy system on a semiconductor substrate having an overlying insulating layer comprising,
- depositing a first layer of aluminum alloy which at least includes copper onto the substrate over said insulating layer, and depositing an overlying surface layer of pure aluminum on said aluminum alloy layer,
- anodizing at least a portion of the pure aluminum layer to form a thin blanket layer of $Al_2O_3$,
- depositing, exposing and developing a photoresist layer on the surface of said thin $Al_2O_3$ blanket layer which leaves exposed the desired metallurgy pattern,
- anodizing the exposed portions of said pure aluminum layer in an electrolyte to form a barrier layer which defines the desired metallurgy pattern,
- removing the photoresist,
- anodizing the device to form a porous $Al_2O_3$ insulating layer until the aluminum alloy layer not covered by the previously formed barrier layer is completely converted to $Al_2O_3$.

References Cited

UNITED STATES PATENTS

| | | | |
|---|---|---|---|
| 3,634,203 | 1/1972 | McMahon | 204—15 |
| 3,690,966 | 9/1972 | Hayashi et al. | 156—17 |
| 3,461,347 | 8/1969 | Lemelson | 317—101 |
| 3,741,880 | 6/1973 | Shiba et al. | 204—42 |

FOREIGN PATENTS

| | | | |
|---|---|---|---|
| 1,319,682 | 6/1973 | Great Britain | 204—15 |
| 1,276,745 | 6/1972 | Great Britain | 204—15 |

THOMAS M. TUFARIELLO, Primary Examiner

U.S. Cl. X.R.

317—234 R